(12) United States Patent
Butler et al.

(10) Patent No.: US 8,493,553 B2
(45) Date of Patent: Jul. 23, 2013

(54) LITHOGRAPHIC APPARATUS HAVING A FEED FORWARD PRESSURE PULSE COMPENSATION FOR THE METROLOGY FRAME

(75) Inventors: Hans Butler, Best (NL); Martinus Van Duijnhoven, Deurne (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 617 days.

(21) Appl. No.: 12/479,145

(22) Filed: Jun. 5, 2009

(65) Prior Publication Data
US 2009/0316129 A1 Dec. 24, 2009

Related U.S. Application Data

(60) Provisional application No. 61/129,316, filed on Jun. 18, 2008.

(51) Int. Cl.
*G03B 27/52* (2006.01)
(52) U.S. Cl.
USPC ............... 355/77; 355/50; 355/53; 310/12.06
(58) Field of Classification Search
USPC ............................ 355/50, 53, 77; 310/12.06
See application file for complete search history.

(56) References Cited

U.S. PATENT DOCUMENTS

| | | | |
|---|---|---|---|
| 5,812,420 A * | 9/1998 | Takahashi | 700/280 |
| 6,538,719 B1 * | 3/2003 | Takahashi et al. | 355/53 |
| 7,110,083 B2 * | 9/2006 | Loopstra et al. | 355/53 |
| 2005/0041233 A1 * | 2/2005 | Van Schothorst et al. | 355/72 |
| 2005/0224687 A1 * | 10/2005 | Heertjes et al. | 248/638 |
| 2005/0270506 A1 * | 12/2005 | Streefkerk et al. | 355/53 |
| 2006/0279716 A1 * | 12/2006 | Cox et al. | 355/53 |

* cited by examiner

*Primary Examiner* — Thomas R Artman
(74) *Attorney, Agent, or Firm* — Pillsbury Winthrop Shaw Pittman LLP

(57) ABSTRACT

A lithographic apparatus including a projection system configured to project a patterned radiation beam onto a target portion of a substrate; a metrology frame supported by a vibration isolation support device; an object movable with respect to the metrology frame; and a displacement determining unit to determine positions, speeds and/or accelerations of the object with respect to the metrology frame and/or the projection system. At least one actuator is provided for applying correcting forces and/or torques on the metrology frame, and a controller is provided which is configured to calculate the correcting forces and/or torques to be applied to the metrology frame based on the determined positions, speeds and/or accelerations of the object in order to compensate for pressure pulses exerted on the metrology frame due to movements of the object with respect to the metrology frame.

15 Claims, 2 Drawing Sheets

LITHOGRAPHIC APPARATUS HAVING A FEED FORWARD PRESSURE PULSE COMPENSATION FOR THE METROLOGY FRAME

CROSS REFERENCE TO RELATED APPLICATIONS

This application claims priority and benefit under 35 U.S.C. §119(e) to U.S. Provisional Patent Application No. 61/129,316, entitled "Lithographic Apparatus Having A Feed Forward Pressure Pulse Compensation For The Metrology Frame", filed on Jun. 18, 2008. The content of that application is incorporated herein in its entirety by reference.

FIELD

The present invention relates to a lithographic apparatus and a method for manufacturing a device having a feed forward pressure pulse compensation for the metrology frame.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus it is known to provide both a base frame to be supported on the ground and a so-called metrology frame, which a frame that is vibration isolated from the base frame and/or the ground. The metrology frame supports the projection system. During use, stages for supporting and/or holding the patterning device and/or substrate are moved at high speeds closely alongside part of the metrology frame, or parts connected to the metrology frame.

SUMMARY

When such a stage moves, a 'high pressure' area of compressed gas/air is present in front of the stage, while a 'low pressure' area of expanded gas/air is present behind the stage. The high pressure exerts a vertical pushing force on the metrology frame, while the low pressure exerts a pulling force on the metrology frame. The end result is an applied torque on the metrology frame, that causes the metrology frame to rotate. Air mounts between the metrology frame and the base frame attempt to keep the metrology frame still.

However, for example at a scanning frequency with which the stages move of 3 Hz, remaining movements of +/−30 to 60 um of the metrology frame may still occur. These movements of the metrology frame may induce quasi-static deformations of amongst others a projection system which is connected to the metrology frame. In particular a projection lens thereof might get deformed, and internal displacements of lens elements with respect to a lens mantle may occur. These deformations are not measured by a stage position measurement and are therefore not tracked by the stages. This may result in an overlay contribution of more than 0.4 nm.

An embodiment of the invention is directed to an efficient feed forward compensation mechanism for pressure pulses caused by movements of objects of the apparatus with respect to a metrology frame thereof.

According to an embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; a metrology frame supported by means of a vibration isolation support device; an object movable with respect to the metrology frame; and a displacement determining unit to determine positions, speeds and/or accelerations of the object with respect to the metrology frame and/or the projection system; wherein at least one actuator is provided to apply correcting forces and/or torques on the metrology frame, and wherein a controller is provided which is configured to calculate the correcting forces and/or torques to be applied to the metrology frame based on the determined positions, speeds and/or accelerations of the object in order to compensate for pressure pulses exerted on the metrology frame due to movements of the object with respect to the metrology frame.

According to an embodiment of the invention, there is provided a device manufacturing method including transferring a pattern from a patterning device onto a substrate, further including conditioning a radiation beam; supporting a patterning device; imparting the radiation beam with a pattern in its cross-section to form a patterned radiation beam; holding a substrate on a substrate table; projecting a patterned radiation beam onto a target portion of the substrate; supporting a metrology frame by means of a vibration isolation support device; moving an object of the apparatus with respect to the metrology frame; determining positions, speeds and/or accelerations of the object with respect to the metrology frame; calculating correcting forces and/or torques to be applied to the metrology frame based upon the determined positions, speeds and/or accelerations of the object in order to compensate for pressure pulses exerted on the metrology frame due to movements of the object with respect to the metrology frame; and applying the correcting forces and/or torques to the metrology frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
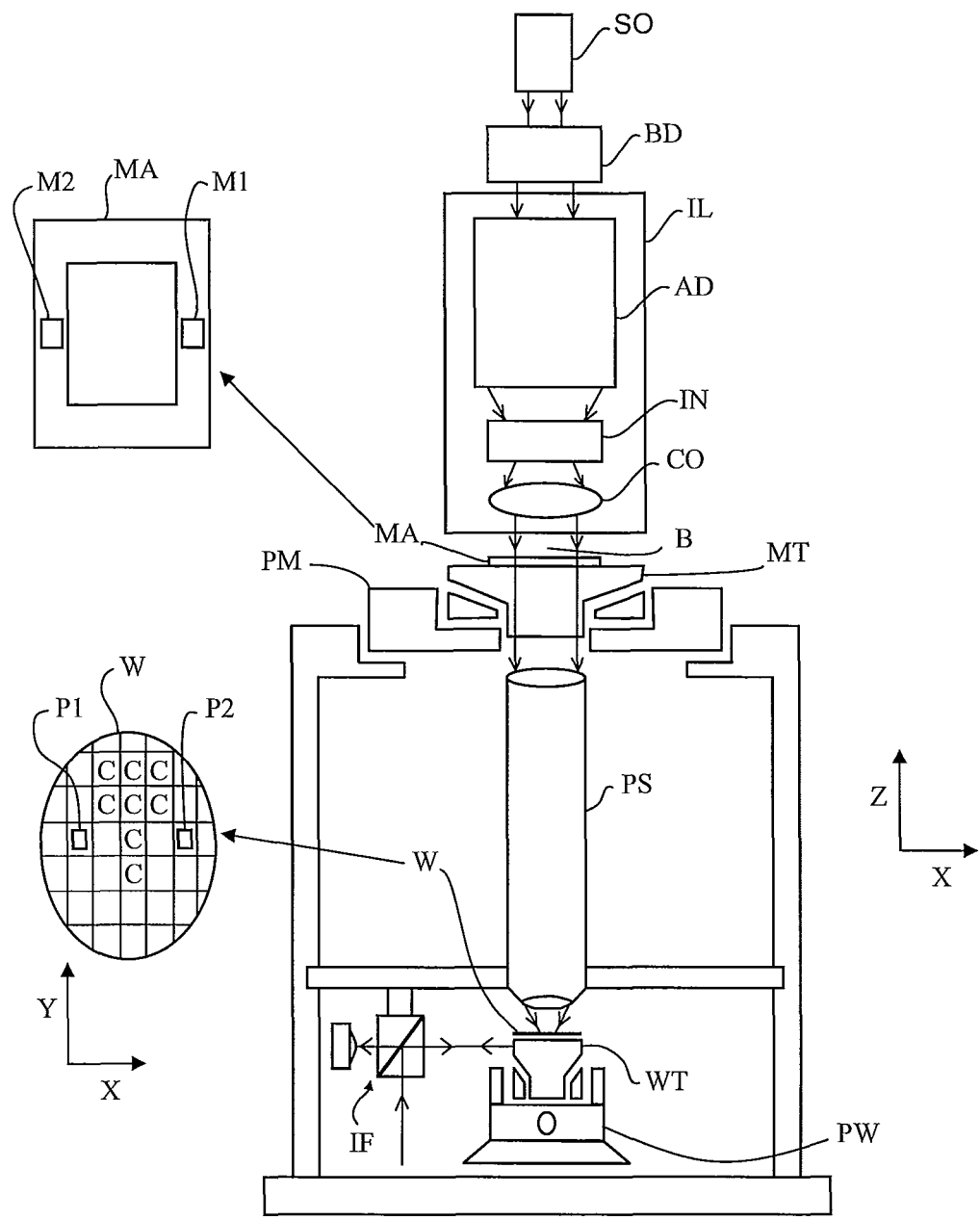
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage", machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and (σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
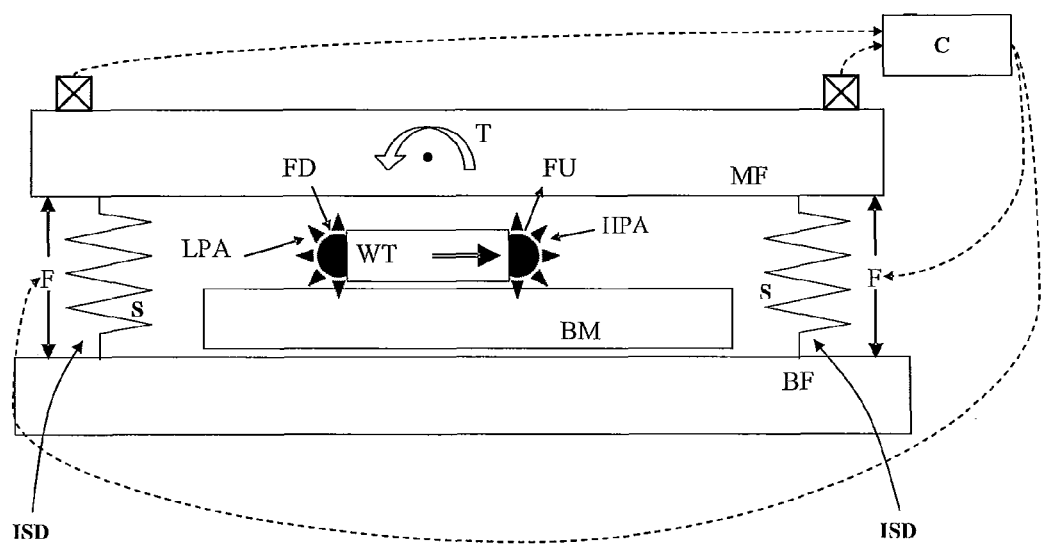
FIG. 2 schematically shows part of the apparatus of FIG. 1 with pressure pulse compensation for the metrology frame at a location of the substrate table.

In FIG. 2 part of the lithographic apparatus of FIG. 1 is more schematically shown. FIG. 2 shows the substrate table WT and, a balance mass BM which are moveable in opposite horizontal directions with respect to both a base frame BF and a metrology frame MF. The metrology frame MF is supported with several vibration isolation support devices ISD on the base frame BF. The base frame is supported on the ground. The substrate table WT and balance mass BM are supported on the base frame BF. Each vibration isolation support device ISD includes a spring S, for example a gas bearing like an air mount, as well as an actuator F, in particular an actuator to exert a vertical force upon the metrology frame MF. Together the actuators F of the several vibration isolation support devices ISD are able to not only exert forces on the metrology frame, but in addition or in the alternative to exert torques thereupon.

The substrate table WT is movable side by side to the metrology frame MF, in particular in a horizontal direction underneath a lower surface of the metrology frame MF. Displacement measuring devices or sensors are connected to the metrology frame MF (not shown). Together the displacement measuring devices or sensors are positioned and arranged to measure positions, speeds and/or accelerations and/or other position related signals of the substrate table WT with respect to the metrology frame MF and/or the projection system supported by the metrology frame MF. The measured positions are used in a control loop to position the substrate table WT in a desired location. In operation, the measured position is compared with a position setpoint, and the difference is minimized by a controller. The position setpoint is generated with a setpoint generator. As this difference is in the order of magnitude of 10 nm, both the position setpoint of the substrate WT and the measured position of the substrate table WT provide an accurate measure of the position of the substrate table WT.

When the substrate table WT moves, a 'high pressure' area HPA develops in front of the substrate table WT, while a 'low pressure' area LPA develops behind the substrate table WT. The high pressure exerts a local substantially upwardly directed pushing force Fu on the metrology frame MF, while the low pressure exerts a local substantially downwardly directed pulling force Fd on the metrology frame MF. If no correction were to take place, the end result of this would be a torque T applied on the metrology frame MF, that would cause the metrology frame MF to rotate somewhat. The resulting torque T on the metrology frame MF is a time dependent function of the acceleration and velocity of the substrate table WT. Also, the absolute position of the substrate table WT underneath the metrology frame MF influences the resulting torque T. For example, near the edges of the working area, that is to say the edges of the area below that part of the metrology frame MF the substrate table WT is moving, it might be possible that the developed low-pressure area LPA exerts a smaller pulling force Fd on the metrology frame MF because air can more easily be supplied from the sides. In such a case, a net vertical force could be exerted on the metrology frame MF, as the pushing force Fu from the high-pressure area HPA could remain large.

According to an embodiment of the present invention, the actuators F of the vibration isolation support devices ISD are used to apply correct forces that generate torques on the metrology frame MF with respect to the base frame BF. For this a controller C is provided which is configured to calculate the correcting forces/torques to be applied on the metrology frame MF based upon the positions, speeds and/or accelerations measured at a given moment in time by the displacement measuring devices DMD of the substrate table WT, or the momentary position, speed and/or acceleration setpoint values of the substrate table WT. As the difference between the position setpoints and the actual position of the substrate table WT is very small, especially with respect to the desired accuracy in this feedforward. During use, for example, during a scanning operation, the controller C each time receives the measured position, speed and/or acceleration of the substrate table WT or the setpoint position, speed and/or acceleration of the substrate table WT, calculates the desired correcting forces/torques, and sends out a steering signal towards the actuators F in order for them to apply the calculated correcting forces/torques to the metrology frame MF. This way, any possible metrology frame MF motion due to pressure pulses coming from movements of the substrate table WT is compensated.

Figure 3:
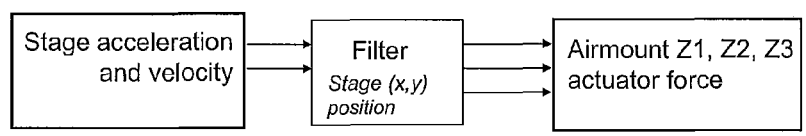
FIG. 3 shows the input and output variables for the controller/filter of FIG. 2 in accordance with an embodiment of the invention.

The pressure buildup (in the HPA) as a result of motion of the stage, in this case the substrate table WT, is substantially proportional to the acceleration of the substrate stage. The same holds for the lowering of the pressure (in the LPA) behind the stage. The torque exerted on the metrology frame MF is proportional to the difference in pressure in the HPA and the LPA, and hence is also proportional to the acceleration of the stage. This implies that basically, the correction torque needed on the metrology frame that counteracts the effects of the pressure pulses created by stage motion, is proportional to the stage acceleration. The proportionality factor is dependent on the position of the stage. Especially at the edges of the stage's working area, the air that surrounds the stage is in communication with the outside world, which may reduce the proportionality factor. Also, the pressure in the HPA may rise differently (depending on the stage's position) than the pressure in the LPA drops. Then, a net vertical force is acting on the metrology frame, requiring a compensating force in vertical direction as well. In practice, because of the machine's buildup, containing many components influencing air flow, a force and/or torque in all 6 degrees of freedom acts on the metrology frame as a result of the pressure pulses induced by stage motion. All forces and torques are substantially proportional to stage acceleration, with a proportionality factor dependent on the stage position. Also, if more than one stage is present in the same compartment, the position of the other stage may influence the effect of pressure pulses on the metrology frame, because the position of this stage determines the ease with which air flows in the compartment, hence influencing the pressure buildup in HPA and LPA as well. All these effects are included in the block 'Filter' in FIG. 3.

The dependency between the measured position, speed and/or acceleration of the substrate table WT and the desired correcting force/torque to be applied can be determined mathematically. However, the correct controller (filter) contents are determined by calibration and entered into the controller. By making large substrate table movements on various positions, the correct dependencies on acceleration, velocity and position can be determined.

Thus, according to an embodiment of the invention a reliable feed forward system is provided with which it is possible to have an efficient compensation for pressure pulses caused by rapid movements of the substrate table. This is particularly beneficial because the space between the substrate table WT and the metrology frame MF is small and in fact too small for a (steel) plate member constructed to stop pressure pulses, to be placed between the substrate table WT and the metrology frame MF. The compensation according to an embodiment of the present invention results in significantly reduced movements of the metrology frame MF and in a better overlay during a lithographic process. In practice, an improvement in overlay could be achieved of 0.4 nm.

Besides the embodiment shown, numerous variant embodiments are possible. Instead of a compensation for pressure pulses coming from movements of the substrate table, pressure pulses coming from other objects may also be compensated for. For example pressure pulses arising from movements of the support for the patterning device of the lithographic apparatus, which might also be moved at high speeds and accelerations with respect to a vibration isolated frame part of the apparatus, may likewise be compensated for. Furthermore, other types of measuring devices and/or other types of vibration isolation support devices, like magnets, weak springs, etc. may be used. Instead of using the actuators of the vibration isolation support devices, it is also possible to use separate dedicated actuators for exerting the compensating forces/torques upon the metrology frame. In the example shown, the substrate table is not directly supported on the metrology frame, but instead, together with its balance mass, is supported on the base frame. In a variant, it is also possible to use an embodiment of the present invention for compensation of pressure pulses coming from an object which is both moveable with respect to and supported on the metrology frame.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
 a support constructed to support a patterning device, the patterning device being capable of imparting a radiation beam with a pattern in its cross-section to form a patterned radiation beam;
 a substrate table constructed to hold a substrate;
 a projection system configured to project the patterned radiation beam onto a target portion of the substrate;
 a metrology frame supported by a vibration isolation support device;
 an object movable with respect to the metrology frame;
 a sensor configured to determine a position, or a speed, or an acceleration, or any combination of the foregoing, of the object with respect to the metrology frame, or the projection system or both the metrology frame and the projection system;
 an actuator configured to apply a correcting force on the metrology frame; and
 a controller configured to calculate the correcting force to be applied to the metrology frame based on a correlation between the determined position, speed and/or acceleration of the object, and the effects of gas pressure pulses exerted on the metrology frame as caused by the determined position, speed and/or acceleration of the object relative to the metrology frame.

2. The lithographic apparatus according to claim 1, wherein the object is the substrate table.

3. The lithographic apparatus according to claim 1, wherein the sensor is a laser interferometer.

4. The lithographic apparatus according to claim 1, further comprising a setpoint generator configured to apply a setpoint signal to position the substrate table to a desired position.

5. The lithographic apparatus according to claim 1, wherein the actuator is part of the vibration isolation support device.

6. The lithographic apparatus according to claim 1, wherein the vibration isolation support device comprises a gas spring.

7. The lithographic apparatus according to claim 1, wherein a dependency between position, or speed, or acceleration, or any combination of the foregoing, of the object and the correcting force to be applied in the controller has been determined by calibration and entered into the controller.

8. The lithographic apparatus according to claim 1, wherein the object is movable along a direction adjacent the metrology frame.

9. The lithographic apparatus according to claim 1, wherein the object is movable in a horizontal direction underneath a surface of the metrology frame, and wherein the actuator is configured to exert vertical forces on the metrology frame.

10. The lithographic apparatus according to claim 1, wherein the correcting force generates a torque on the metrology frame.

11. A device manufacturing method comprising:
 projecting a patterned radiation beam onto a target portion of a substrate;
 supporting a metrology frame with a vibration isolation support device;
 moving an object with respect to the metrology frame;
 determining a position, or a speed, or an acceleration, or any combination of the foregoing, of the object with respect to the metrology frame;
 calculating a correcting force to be applied to the metrology frame based on a correlation between the determined position, speed and/or acceleration of the object, and the effects of gas pressure pulses exerted on the metrology frame as caused by the determined position, speed and/or acceleration of the object relative to the metrology frame; and
 applying the correcting force to the metrology frame.

12. The method of claim 11, wherein the correcting force generates a torque on the metrology frame.

13. The lithographic apparatus according to claim 1, wherein the controller includes a mathematical model that converts the determined speed, and the determined position or acceleration, or both the determined position and acceleration into the correcting force.

14. The lithographic apparatus according to claim 1, wherein the controller includes calibration data that convert the determined speed, and the determined position or acceleration, or both the determined position and acceleration into the correcting force.

15. A lithographic apparatus comprising:
 a support constructed to support a patterning device, the patterning device being capable of imparting a radiation beam with a pattern in its cross-section to form a patterned radiation beam;
 a substrate table constructed to hold a substrate;
 a projection system configured to project the patterned radiation beam onto a target portion of the substrate;
 a metrology frame supported by a vibration isolation support device;
 an object movable with respect to the metrology frame;
 a sensor configured to determine a position, or a speed, or an acceleration, or any combination of the foregoing, of the object with respect to the metrology frame, or the projection system or both the metrology frame and the projection system;
 an actuator configured to apply a correcting force on the metrology frame; and
 a controller configured to calculate the correcting force to be applied to the metrology frame based on a correlation between the determined position, speed and/or acceleration of the object, and the effects of gas pressure pulses exerted on the metrology frame as caused by the determined position, speed and/or acceleration of the object relative to the metrology frame.

* * * * *